(12) United States Patent
Hong

(10) Patent No.: US 7,888,673 B2
(45) Date of Patent: Feb. 15, 2011

(54) MONITORING SEMICONDUCTOR DEVICE AND METHOD OF MANUFACTURING THE SAME

(75) Inventor: Ji-Ho Hong, Hwaseong-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 204 days.

(21) Appl. No.: 12/138,724

(22) Filed: Jun. 13, 2008

(65) Prior Publication Data

US 2008/0308883 A1 Dec. 18, 2008

(30) Foreign Application Priority Data

Jun. 14, 2007 (KR) .................... 10-2007-0058109

(51) Int. Cl.
*H01L 23/58* (2006.01)
(52) U.S. Cl. .................. 257/48; 257/412; 257/413; 257/E49.001
(58) Field of Classification Search ............... 257/48, 257/412, 413, E49.001
See application file for complete search history.

(56) References Cited

U.S. PATENT DOCUMENTS 6,621,126 B2 * 9/2003 Russ ..................... 257/355
6,624,487 B1 * 9/2003 Kunz et al. ............. 257/409

* cited by examiner

*Primary Examiner*—Tan N Tran
(74) *Attorney, Agent, or Firm*—Sherr & Vaughn, PLLC

(57) ABSTRACT

Provided is a monitoring pattern for a silicide that may include a plurality of poly pads, a plurality of N-well regions and P-well regions, active regions, and a poly gate line. The plurality of poly pads are disposed on a semiconductor substrate. The plurality of N-well regions and P-well regions are disposed in a single line between the poly pads. The active regions are disposed on the N-well and the P-well regions. The poly gate line electrically connects the active regions to the poly pads and has a configuration permitting it to pass through the active regions a plurality of times.

13 Claims, 5 Drawing Sheets

MONITORING SEMICONDUCTOR DEVICE AND METHOD OF MANUFACTURING THE SAME

Figure 1:
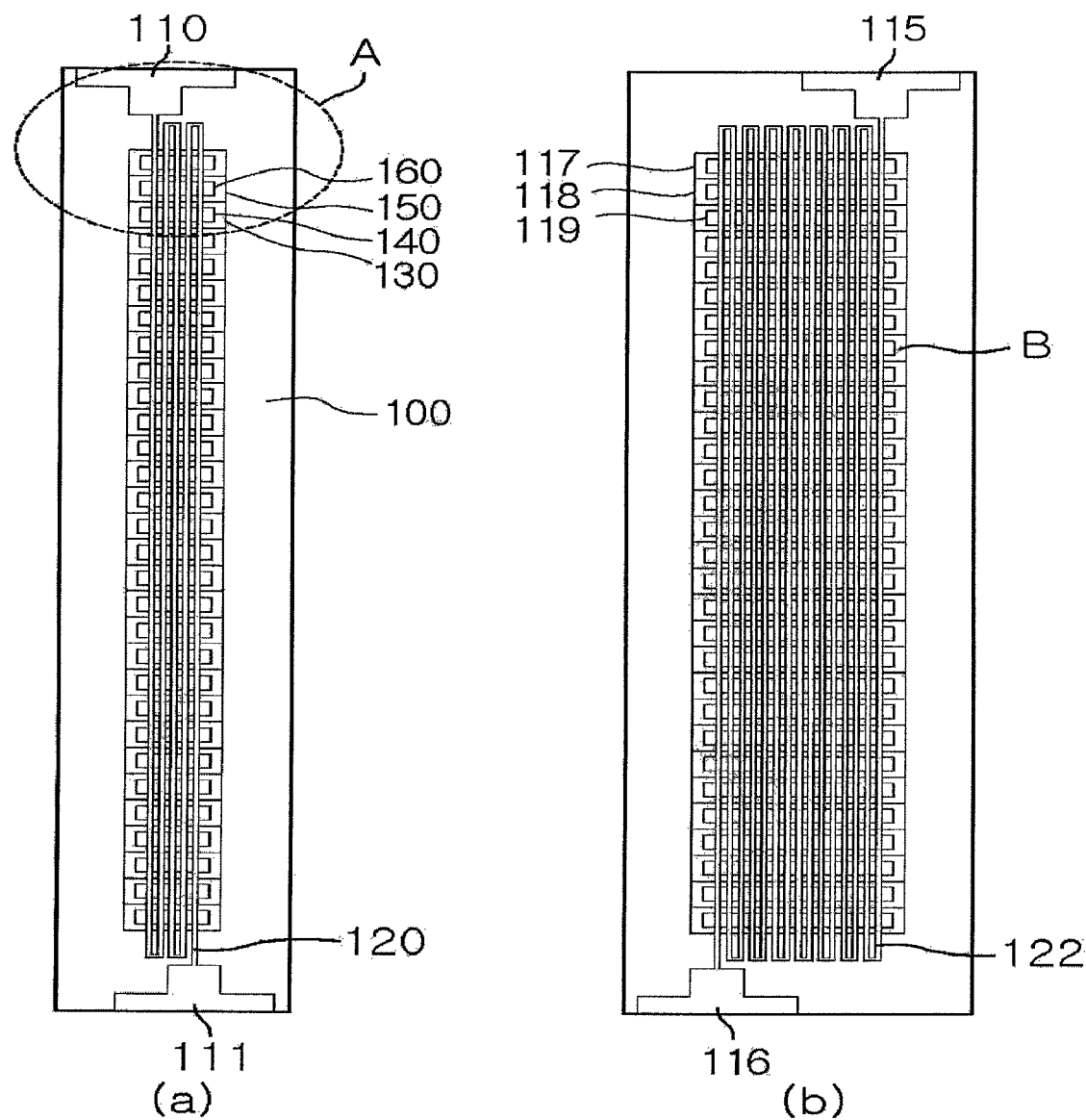

The present application claims priority under 35 U.S.C. §119 and 35 U.S.C. 365 to Korean Patent Application No. 10-2007-0058109 (filed on Jun. 14, 2007), which is hereby incorporated by reference in its entirety.

BACKGROUND

A manufacturing process for a semiconductor device can include a silicidation process of forming a silicide to reduce contact resistances between a gate and source/drain regions and contacts thereon and/or thereover. To detect a defect in the silicidation process, monitoring techniques can be used, such as transmission electron microscope (TEM) analysis for a silicide layer and a method of measuring a contact resistance. TEM analysis is a destructive test which requires sacrificing a wafer and takes a long time for conducting analysis while only monitoring a partial region. Moreover, in the method of measuring a contact resistance, only a region receiving the contact can be monitored. A defect in the contact resistance generated in a source/drain implantation process cannot be detected. In order to monitor a silicide for a poly gate, a contact-forming process can be performed before measuring a contact resistance with respect to a metal interconnection layer. Accordingly, since subsequent processes should be performed, ranging from a process of patterning a poly gate to a process of forming a metal interconnection layer, it can be difficult to perform a monitoring process according to various measurement items. Also, when a resulting semiconductor device throughout the processes has a defect, it should be discarded, thus increasing manufacturing costs.

SUMMARY

Embodiments relate to a non-destructive monitoring pattern for a silicide which can detect a defect in resistance of source/drain implantation regions as well as a contact region.

Embodiments relate to a monitoring pattern for a silicide which can detect a defect in a poly gate line, a spacer pattern, and a silicide by directly measuring the resistance of a poly gate line without performing an additional process of forming a metal interconnection layer.

Embodiments relate to a monitoring pattern for a silicide can include at least one of the following: a plurality of poly pads formed on and/or over a semiconductor substrate; a plurality of N-well regions and P-well regions in a single line between the poly pads; active regions on and/or over the N-well and the P-well regions; and a poly gate line electrically connecting the active regions to the poly pads and having a bent line shape to pass through the active regions a plurality of times, e.g., from two to ten times) and includes the silicide through at least one of Co, Ni, and Ta.

Embodiments relate to a monitoring pattern for a silicide can include at least one of the following: a plurality of poly pads formed spaced apart on a semiconductor substrate; a plurality of N-well regions and P-well regions formed in the semiconductor substrate and between the poly pads; active regions formed in the N-well and the P-well regions; a silicide layer formed on the active regions; a poly gate line electrically connecting the active regions to the poly pads and configured to at least pass through the active regions a plurality of times.

Embodiments relate to a method of manufacturing a monitoring pattern for a silicide that may include at least one of the following steps: forming a plurality of poly pads spaced apart on a semiconductor substrate; and then forming a plurality of N-well regions and P-well regions in semiconductor substrate and between the poly pads; and then forming active regions in the N-well and the P-well regions; and then forming a silicide layer on the active regions; and then forming a poly gate line electrically connecting the active regions to the poly pads and configured to pass through the active regions a plurality of times.

DRAWINGS

Example FIGS. 1 to 4 illustrate monitoring patterns for a silicide, in accordance with embodiments.

Figure 5:
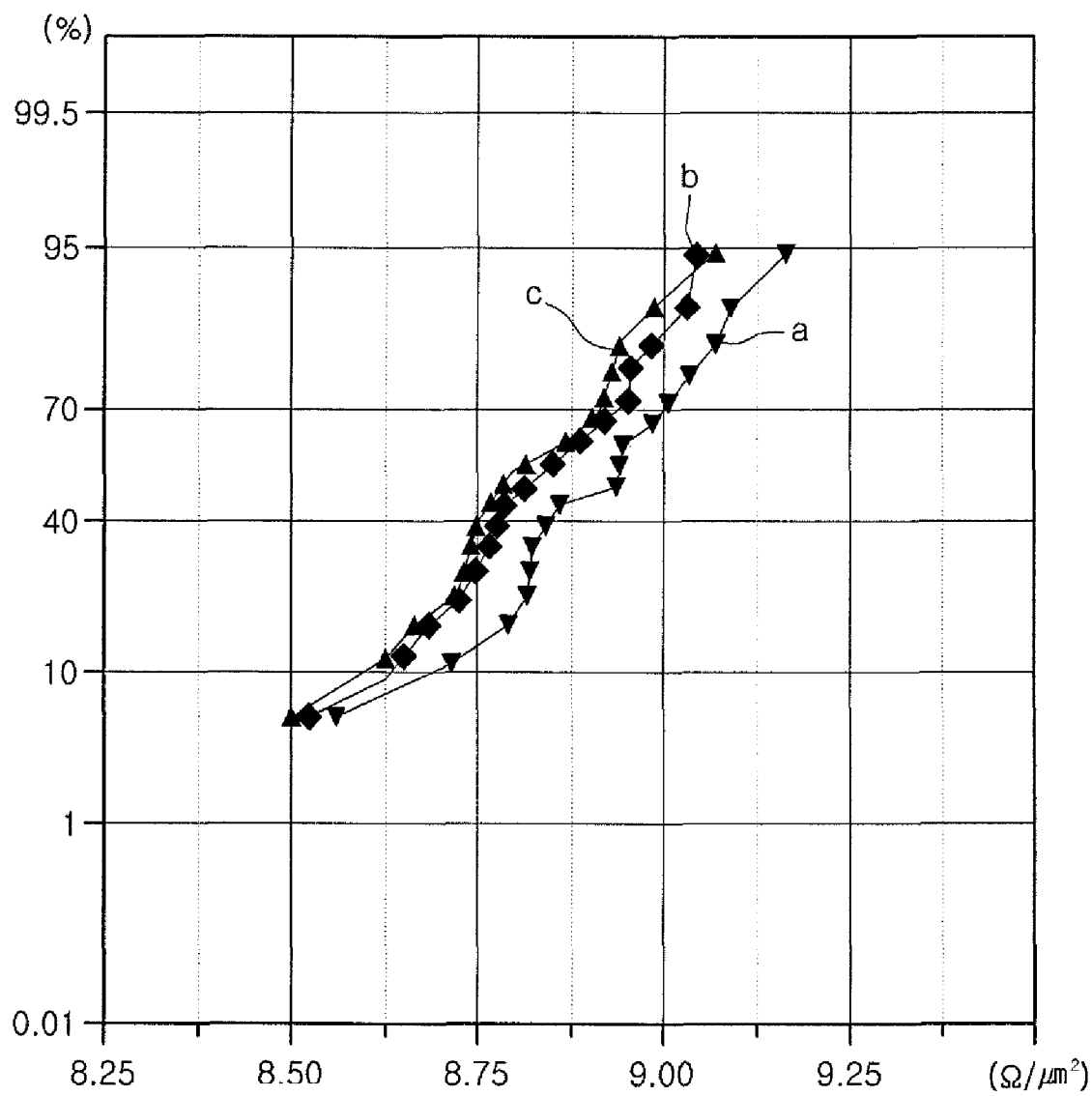

Example FIG. 5 illustrates a measurement graph for a silicidation process through a monitoring pattern for a silicide, in accordance with embodiments.

DESCRIPTION

A monitoring pattern for a silicide in accordance with embodiments will now be described in detail with reference to the accompanying drawings.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

As illustrated in example FIG. 1(a), the monitoring pattern for a silicide in accordance with embodiments may include a pair of poly-pads 110 and 111, a plurality of N-well regions 130 and a plurality of P-well regions 150, a pair of active regions 140 and 160, and poly-gate line 120. Active regions 140 and 160 may be disposed on and/or over well regions 130 and 150. Poly gate line 120 may serve to electrically connect active regions 140 and 160 to poly-pads 110 and 111. Poly-pads 110 and 111 may be disposed on and/or over uppermost and lowermost sides of semiconductor substrate 100, respectively. N-well regions 130 and P-well regions 150 may be disposed in a single line between poly-pads 110 and 111. N-well region 130 and the P-well region 150 may be alternately disposed in contact each other. Active regions 140 and 160 may include a gate region and source/drain regions, and may be disposed in N-well regions 130 and P-well regions 150. The monitoring pattern having such an arrangement in accordance with embodiments may be bar-shaped, and poly gate line 120 may be formed after performing a poly silicidation process. Both distal ends of poly gate line 120 may be connected to poly-pads 110 and 111, respectively. Poly gate line 120 may be formed in an alternating zigzag pattern to pass through active regions 140 and 160 a plurality of times.

As illustrated in example FIG. 1(a), poly gate line 120 is bent four times to pass through active regions 140 and 160 at various positions. Accordingly, a gate region, source/drain regions, a contact region, and a silicide region can be simultaneously monitored by measuring the resistance of poly gate line 120. A silicide may provided on and/or over poly gate line 120 by applying at least one of Co, Ni, and Ta and performing a silicidation process on the applied material. The structure of the monitoring pattern for a silicide in accordance with embodiments and a forming process therefor will be described in detail with reference to example FIG. 3.

As illustrated in example FIG. 1(b), in a silicide monitoring pattern in accordance with embodiments, the widths of N-well regions 117, P-well regions 118 and active regions 119 may be increased and thus, poly gate line 122 may pass through N-well regions 117, P-well regions 118 and active regions 119 an increased number of times. Meaning, poly gate line 122 may be bent 14 times to pass through N-well regions 117, P-well regions 118 and active regions 119 at an increased number of spatial positions. Thus, more precise monitoring for a device region may be achieved when compared to the monitoring illustrated in example FIG. 1(a). Both distal ends of poly gate line 122 passing through N-well regions 117, P-well regions 118 and active regions 119 may be connected to upper poly pad 115 and lower poly pad 116, respectively. The monitoring pattern for a silicide in accordance with embodiments may be used to measure the resistance by bringing a probe in contact with poly-pads 110, 111, 115, and 116. Thus, open/short can be effectively detected in regions through which poly gate lines 120 and 122 pass. Specifically, the deterioration in electrical characteristics due to a silicide defect can be detected by measuring the resistance of poly gate lines 120 and 122.

Figure 2:
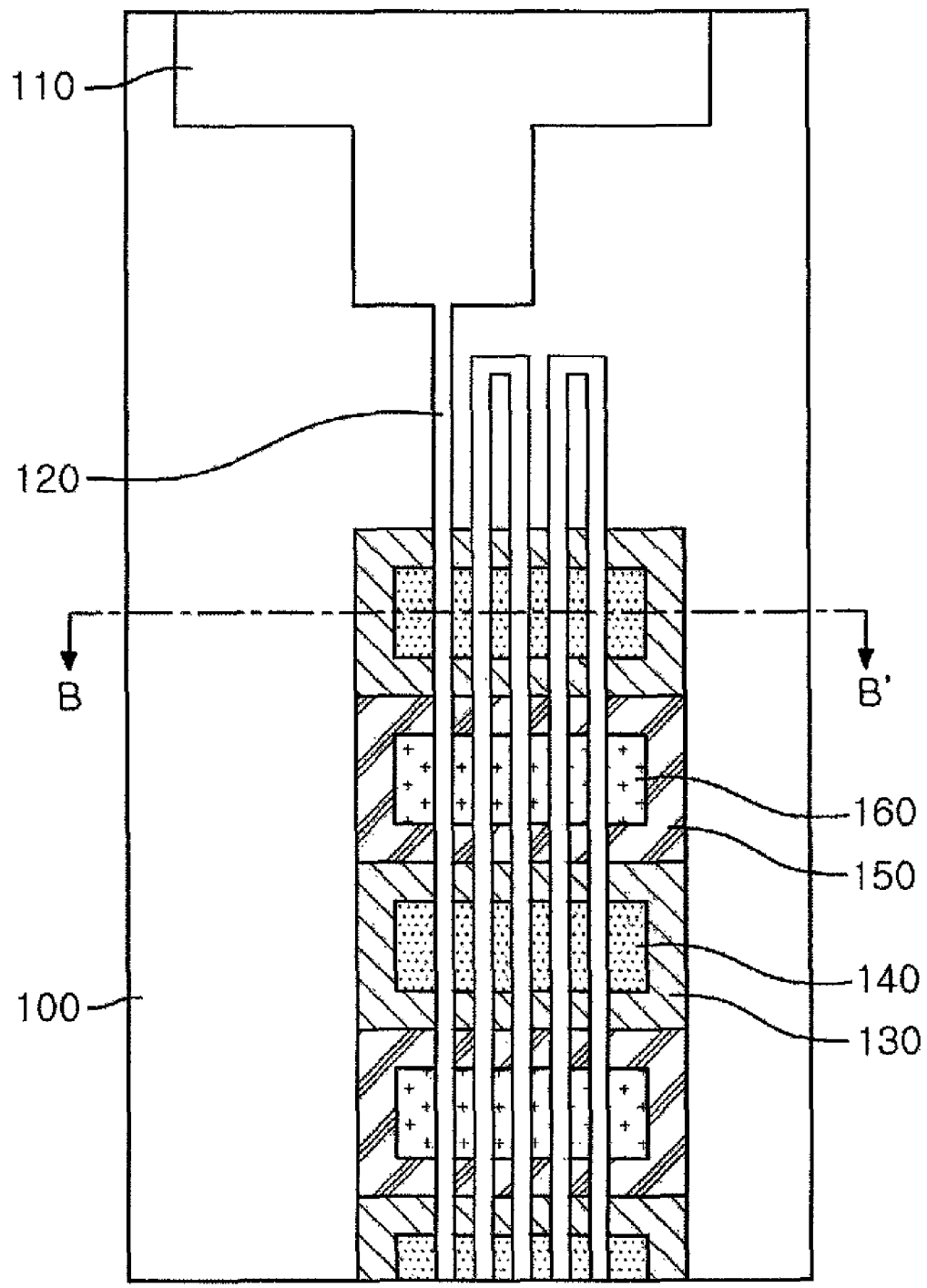

As illustrated in example FIG. 2, a monitoring pattern for a silicide in accordance with embodiments may include N-well regions 130 and P-well regions 150 alternatively disposed in a single line between poly-pads 110 and 111 disposed on and/or over semiconductor substrate 100. Active regions 140 and 160 may be disposed in N-well regions 130 and P-well regions 150, respectively. As described above, poly gate line 120 may be configured in a zigzag pattern or otherwise bent a plurality of times to be electrically connected to and pass through active regions 140 and 160. N-well regions 130 and the P-well regions 150 may be spaced apart from poly-pads 110 and 111 that are electrically connected to each other through poly gate line 120. When an implantation process for forming source/drain is out of a limit, source/drain of the N-well regions 130 may overlap source/drain of P-well regions 150. Accordingly, when an abnormal implantation process is performed, a silicidation process is also abnormally performed by the over dosage of an overlap region. In such a silicidation process, a defect can be detected through the monitoring pattern for a silicide in accordance with embodiments.

Figure 3:
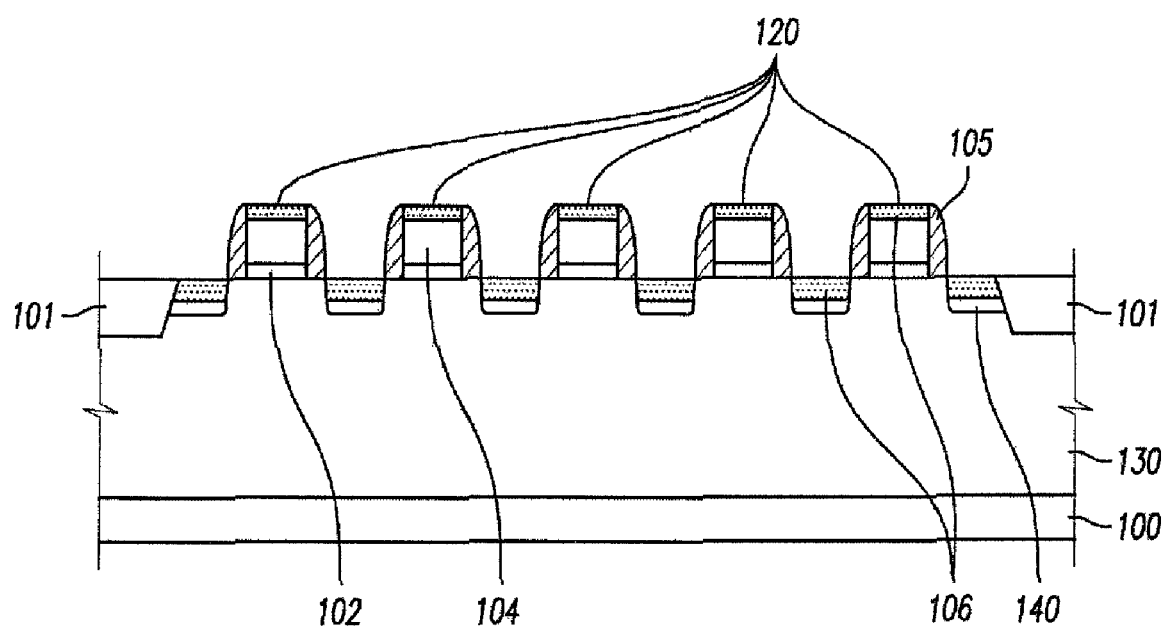

Hereinafter, the structure of the monitoring pattern of a silicide in accordance with embodiments and the forming process therefor will be described in detail with reference to example FIG. 3, which is a cross-sectional view taken along line B-B' of example FIG. 2. As illustrated in example FIG. 3, semiconductor substrate 100 is etched to a predetermined depth to form trench 101 as a device isolation region. A thick dielectric layer may then be deposited on and/or over semiconductor substrate 100 to fill trench 101. The dielectric layer may then be planarized until semiconductor substrate 100 is exposed using a chemical mechanical polishing process, to thereby remove the dielectric layer out of trench 101. When trench 101 is formed, a P-type dopant or N-type dopant material may be implanted into a device isolation region and diffused to form N-well region 130 and P-well region 150. An oxide layer may then be formed on and/or over semiconductor substrate 100 including N-well region 130 and P-well region 150. A photolithography process may then be performed to form gate oxide patterns 102 on and/or over N-well region 130 and P-well region 150. Dopant materials having opposite conductivity, e.g., arsenic (As) or phosphorus (P) as an N-type dopant and boron (B) as a P-type dopant may then be ion-implanted into N-well region 130 and P-well region 150 to form active regions 140. A n+-type poly-silicon layer may then be formed on and/or over gate oxide patterns 102 formed on and/or over P-well regions 150 and p+-type poly-silicon layer 104 may also be formed on and/or over gate oxide patterns 102 on and/or over N-well regions 130. Spacers 105 may then be formed on sidewalls of gate oxide patterns 102 with p+-type poly-silicon 104 and the n+-type poly-silicon.

A silicidation process may then be performed to minimize the resistance of a poly gate electrode and a contact resistance generated in the electrode connection of devices and the connection between devices. To perform the silicidation process, a metal such as at least one of cobalt (Co), nickel (Ni), tantalum (Ta) and combinations thereof may be uniformly deposited using, e.g., an atmospheric pressure chemical vapor deposition (APCVD) method on and/or over semiconductor substrate 100 including trench 101, active regions 140, n+-type poly-silicon region, and p+-type poly-silicon region 104. The metal materials may be deposited in combination, e.g., Ta may be combined for the deposition in a silicidation process using Ni as a target material. In accordance with embodiments illustrated in example FIG. 3, Co may be deposited. When Co is deposited, Co and a silicon material may be combined to form cobalt silicide layer 106 on and/or over active regions 140, the n+-type poly-silicon region and p+-type poly-silicon region 104 through a low temperature rapid thermal annealing (RTA) process. Cobalt silicide 106 may then be selectively etched and a high temperature RTA process may then be performed to allow cobalt silicide 106 to remain on and/or over active regions 140, the n+-type poly-silicon region and p+-type poly-silicon region 104, thereby completing the monitoring pattern for a silicide in accordance with embodiments.

Figure 4:
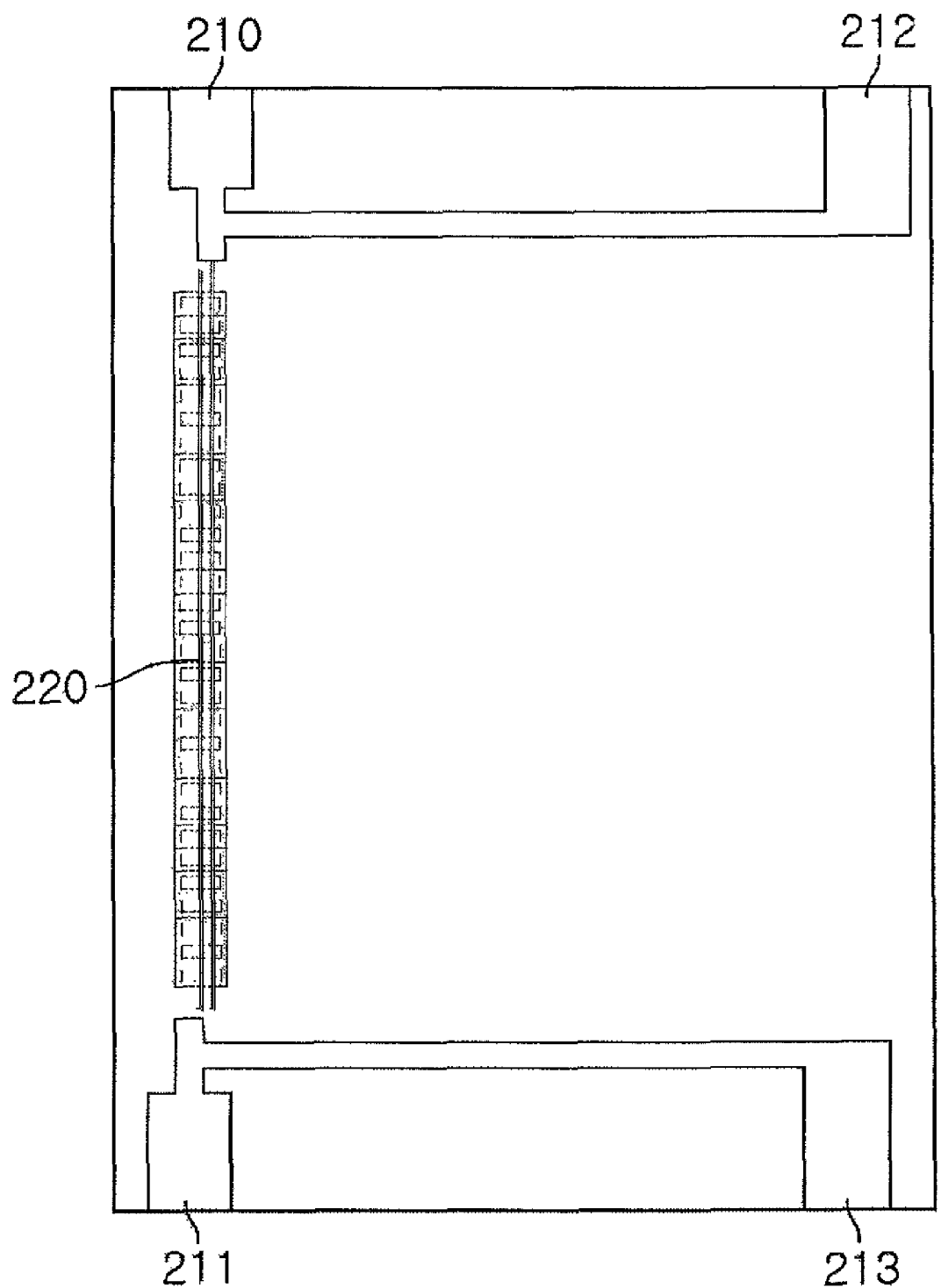

Example FIG. 4 illustrates a monitoring pattern for a silicide in accordance with embodiments. As illustrated in example FIG. 4, the monitoring pattern for a silicide may include a plurality of poly pads 210, 211, 212, and 213 that may be connected to each other in pairs. Meaning, poly pads 210 and 212 may be electrically connected to each other on and/or over an uppermost side of a substrate and poly pads 211 and 213 may be electrically connected to each other on and/or over a lowermost side of the substrate. Embodiments illustrated in example FIG. 4 may include, as in embodiments illustrated and described hereinabove, a plurality of N-well regions, P-well regions, and active regions disposed in a single line between poly pads 210, 211, 212, and 213. Poly gate line 220 may be bent to pass through the active regions a plurality of times. Thus, the descriptions thereof will be omitted. Distal ends of poly gate line 220 passing through the active regions may be electrically connected to poly pads 210 and 212 on and/or over the uppermost side of the substrate and poly pads 211 and 213 on and/or over the lowermost side of the substrate, respectively. In accordance with embodiments, a monitoring pattern having such a four-pad structure is a Van Der Pauw (VDP)-type pattern, which can measure more various electrical characteristics in utilizing four pads. For example, two pads may be used for current measurement while the other two pads may be used for voltage measurement. Accordingly, the resistance of poly gate line 220 may be measured through poly pads 210, 211, 212, and 213 to thereby obtain a more accurate monitoring of the silicidation process. It will be appreciated that in the monitoring pattern for a silicide in accordance with embodiments, device regions may be extended to have a greater width and thus, poly gate line 220 may be bent more times to penetrate the active regions. For example, semiconductor device regions including the well region and the active regions can further extend to an empty region on the right side of the substrate.

As illustrated in example FIG. 5, an X-axis represents measured sheet resistances Rs ($\Omega/\mu m2$) and a Y-axis represents probability values of the measured sheet resistances with respect to a total number of measurements. Process conditions of the silicidation process in accordance with embodiments may include a poly gate line having a thickness ranging from between about 1200 Å to 1400 Å and a line width ranging from between about 0.11 μm to 0.2 μm. The deposited metal material for the silicidation process may include at least one of cobalt (Co), nickel (Ni) and tantalum (Ta) or combinations thereof and may have a thickness ranging from between about 150 Å to 250 Å. A primary heat treatment temperature for the silicide may range from between about 450° C. to 550° C. and a secondary heat treatment temperature may range from between about 750° C. to 850° C. Generally, a silicide on and/or over a poly gate line must meet a resistance reference ranging from between about 8 $\Omega/\mu m2$ to 13 $\Omega/\mu m2$. Accordingly, as illustrated in example FIG. 5, the monitoring pattern formed under the process conditions in accordance with embodiments meets the resistance reference.

A result for the monitoring pattern in accordance with embodiments illustrated in example FIGS. 1-4 illustrate that a resistance may be in a range from about 8.5 $\Omega/\mu m2$ to 9.2 $\Omega/\mu m2$ in both case "a" that the poly gate line has a length of about 150 μm and case "b" that the poly gate line has a length of about 450 μm, which meet the resistance reference. A result for the monitoring pattern in accordance with embodiments illustrated in example FIG. 5 illustrate that in case "c" that the poly gate line has a length of about 150 μm, measured values are similar to those of case "a," which also meet the resistance reference.

The monitoring pattern for a silicide in accordance with embodiments is an open/short detecting pattern for poly gate lines 120 and 220 to make a quick check after several processes and to reduce manufacturing costs, unlike a monitoring method through the measurement of a contact resistance. This is because when a poly gate is patterned, and then the silicidation process is performed, the plurality of poly pads may be electrically checked to detect open/short of poly gate lines 120 and 220. Moreover, in accordance with embodiments, the monitoring pattern for a silicide may be formed under process conditions set forth herein, and other semiconductor devices may be monitored based on a measured value through the monitoring pattern to manufacture an actual product. Therefore, a semiconductor device having improved operation reliability can be effectively manufactured.

The monitoring pattern for a silicide in accordance with embodiments extend numerous advantages. For instance, the resistance of a plurality of poly pads can be directly measured. Secondly, a defect in a spacer pattern and a source/drain implantation process can be effectively monitored by detecting the open/short of the poly gate lines. Thirdly, the reliability of a monitoring process can be enhanced by performing a primary monitoring of the open/short of the poly gate line and a secondary monitoring of the open/short of the poly gate line after the silicidation process. Also, costs of discarding wafers can be saved by differentiating monitoring according to processes.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A monitoring semiconductor device comprising:
   a plurality of polysilicon pads formed spaced apart on a semiconductor substrate;
   a plurality of N-well regions and P-well regions formed in the semiconductor substrate and between the polysilicon pads;
   active regions formed in the N-well and the P-well regions;
   a silicide layer formed on the active regions; and
   a polysilicon gate line electrically connecting the active regions to the polysilicon pads and configured to at least pass through the active regions a plurality of times,
   wherein the plurality of polysilicon pads comprises four, and
   wherein at least one of the polysilicon pads is connected to a current-measuring terminal of a measuring device and the other one of the polysilicon pads is connected to a voltage-measuring device.

2. The monitoring semiconductor device of claim 1, wherein the silicide layer comprises at least one of cobalt, nickel and tantalum.

3. The monitoring semiconductor device of claim 1, wherein the silicide layer has a thickness ranging from between about 150 Å to 250 Å.

4. The monitoring semiconductor device of claim 1, wherein the plurality of polysilicon pads comprises two polysilicon pads.

5. The monitoring semiconductor device of claim 4, wherein distal ends of the polysilicon gate line are connected to the polysilicon pads, respectively.

6. The monitoring semiconductor device of claim 4, wherein the N-well regions and the P-well regions are formed in contact with each other and disposed in an alternating pattern.

7. The monitoring semiconductor device of claim 4, wherein the polysilicon gate line has a thickness ranging from between about 1200Å to 1400Å.

8. The monitoring semiconductor device of claim 1, wherein the N-well regions and the P-well regions are formed in contact with each other and disposed in an alternating pattern.

9. The monitoring semiconductor device of claim 1, further comprising:
   device isolation regions formed on the semiconductor substrate; and
   a plurality of gate oxide patterns comprising N+-type polysilicon formed on the P-well region;
   wherein the polysilicon gate line is formed on the gate oxide patterns, the P-well regions are formed between the device isolation regions and the active regions comprise source regions and drain regions alternately disposed on both sides of the polysilicon gate line.

10. The monitoring semiconductor device of claim 9, wherein the silicide layer is formed on the polysilicon gate line and the active regions.

11. A monitoring semiconductor device comprising:
    a plurality of polysilicon pads formed spaced apart on a semiconductor substrate;
    a plurality of N-well regions and P-well regions formed in the semiconductor substrate and between the polysilicon pads;

active regions formed in the N-well and the P-well regions;
a silicide layer formed on the active regions; and
a polysilicon gate line electrically connecting the active regions to the polysilicon pads and configured to at least pass through the active regions a plurality of times,
wherein the plurality of polysilicon pads comprises four,
wherein a first pair of the polysilicon pads are connected to each other and a second pair of polysilicon pads are connected to each other, and
wherein at least one of the polysilicon pads is connected to a current-measuring terminal of a measuring device and the other one of the polysilicon pads is connected to a voltage-measuring device.

12. The monitoring semiconductor device of claim 11, wherein distal ends of the polysilicon gate line are connected to the first and second pair of polysilicon pads, respectively.

13. A monitoring semiconductor device comprising:
a plurality of polysilicon pads formed spaced apart on a semiconductor substrate;
a plurality of N-well regions and P-well regions formed in the semiconductor substrate and between the polysilicon pads;
active regions formed in the N-well and the P-well regions;
a silicide layer formed on the active regions;
a polysilicon gate line electrically connecting the active regions to the polysilicon pads and configured to at least pass through the active regions a plurality of times;
device isolation regions formed in the semiconductor substrate; and
a plurality of gate oxide patterns on the N-well regions,
wherein the poly gate line is formed on the gate oxide patterns, the N-well regions are formed between the device isolation regions and the active regions comprise source regions and drain regions alternately disposed on both sides of the poly gate line, and
wherein the silicide layer is formed on the polysilicon gate line and the active regions.

* * * * *